(12) United States Patent
Takeda et al.

(10) Patent No.: US 7,022,183 B2
(45) Date of Patent: Apr. 4, 2006

(54) SEMICONDUCTOR THIN FILM AND PROCESS FOR PRODUCTION THEREOF

(75) Inventors: Kazuo Takeda, Tokorozawa (JP); Jun Gotou, Mobara (JP); Masakazu Saito, Mobara (JP); Makoto Ohkura, Fuchu (JP); Takeshi Satou, Kokubunji (JP); Hiroshi Fukuda, Kodaira (JP); Takeo Shiba, Kodaira (JP)

(73) Assignee: Hiatchi, Ltd., Tokyo (JP)

( * ) Notice: Subject to any disclaimer, the term of this patent is extended or adjusted under 35 U.S.C. 154(b) by 71 days.

(21) Appl. No.: 10/462,792

(22) Filed: Jun. 17, 2003

(65) Prior Publication Data

US 2004/0060504 A1 Apr. 1, 2004

(30) Foreign Application Priority Data

Sep. 30, 2002 (JP) .............................. 2002-284735

(51) Int. Cl.
*C30B 23/00* (2006.01)
(52) U.S. Cl. .................. 117/92; 117/103; 117/106; 117/108; 117/904
(58) Field of Classification Search .................. 117/92, 117/103, 106, 108, 904; 438/166, 486
See application file for complete search history.

(56) References Cited

U.S. PATENT DOCUMENTS 6,322,625 B1 11/2001 Im
6,368,945 B1 4/2002 Im
6,440,824 B1 * 8/2002 Hayashi et al. ............. 438/486
6,602,744 B1 * 8/2003 Ino et al.

FOREIGN PATENT DOCUMENTS

JP 2000-82669 9/1998
JP 2000-306859 4/1999

OTHER PUBLICATIONS

J. P. Colinge, E. Demoulin, D. Bensahel and G. Auvert, "Use of Selective Annealing for Growing Very Large Grain Silicon on Insulator Films", Appl. Phys. Lett. 41(4), Aug. 15, 1982, pp. 346-347.

(Continued)

*Primary Examiner*—Felisa C. Hiteshew
(74) *Attorney, Agent, or Firm*—Reed Smith LLP; Stanley P. Fisher, Esq.; Juan Carlos A. Marquez, Esq.

(57) ABSTRACT

To improve the laser annealing process for polycrystallizing amorphous silicon to form silicon thin films having large crystal particle diameters at a high throughput, the present invention is directed to a process of crystallization by irradiation of a semiconductor thin film formed on a substrate with pulsed laser light. The process comprises having a means to shape laser light into a linear beam and a means to periodically and spatially modulate the intensity of pulsed laser in the direction of the long axis of the linear beam by passing through a phase-shifting stripy pattern perpendicular to the long axis, and collectively forming for each shot a polycrystalline film composed of crystals which have grown in a certain direction over the entire region irradiated with the linear beam.

20 Claims, 13 Drawing Sheets

OTHER PUBLICATIONS

Wen-Chang Yeh and Masakiyo Matsumura, "Preparation of Giant-Grain Seed Layer for Poly-Silicon Thin-Film Solar Cells", Jpn. J. Appl. Phys. vol. 38 (1999), pp. L110-L112.

"CrystaLas UV Optics System for Excimer Laser Based Crystallization of thin Silicon Films", MicroLas Lasersystem GMBH, 7 pages.

Do-Hyun Choi, Kazuhiro Shimizu, Osamu Sugiura and Masakiyo Matsumura, "Drastic Enlargement of Grain Size of Excimer-Laser-Crystallized Polysilicon Films", Jpn. J. Appl. Phys. vol. 31 (1992), pp. 4545-4549.

* cited by examiner

PITCH OF MASK PATTERN

ARRAY OF HILLOCKS

4 SHOTS OVERLAP ANNEALED AREA

ARRAY OF HILLOCKS

SEMICONDUCTOR THIN FILM AND PROCESS FOR PRODUCTION THEREOF

BACKGROUND OF THE INVENTION

1. Field of the Invention

The present invention relates to a semiconductor thin film and a process for production thereof. It is applicable to semiconductor devices including polysilicon thin film transistors (for liquid crystal displays), solar cells, and SOI devices.

2. Description of Related Art

A liquid crystal display has thin film transistors (TFTs) as driving devices. The active layer of TFTs is dominated by polysilicon (poly-Si) film rather than amorphous silicon (a-Si) film, because the former permits carriers (electrons in n-channel and holes in p-channel) high mobility and helps realize smaller cells for a fine pitch display. Another advantage of poly-Si film is the capability of low-temperature annealing by laser. This technique, unlike ordinary annealing that needs a high-temperature process (at 1000° C. or above), prevents the substrate from getting hot during annealing and hence permits TFTs to be formed on an inexpensive glass substrate.

The laser annealing process is designed to scan a-Si film formed on a glass substrate with an absorbable laser beam, thereby converting a-Si film into poly-Si film. It is one of the important processes used for the production of low-temperature polysilicon thin film transistors. Laser annealing is accomplished by using a pulsed excimer laser (in the form of linear beam) with a wavelength of 308 nm. The linear beam is required to have a uniform intensity distribution over its long axis. With a uniform intensity distribution, the linear beam offers an advantage of achieving annealing with a less number of scans but suffers a disadvantage of requiring more than 20 overlapping shots. A new idea to eliminate this inconvenience has been proposed. It is based on the principle that crystals grow from a low-temperature region to a high-temperature region under the condition that the intensity distribution of the laser beam is spatially controlled. In this way it is possible to obtain polycrystalline silicon composed of large crystal grains by means of low overlapping shots. One way to spatially control the intensity distribution of laser irradiation is reported in Appl. Phys. Lett. 41 (1982) 346. According to this literature, the object is achieved by forming a patterned antireflection film on an amorphous silicon film, thereby controlling the intensity distribution in the amorphous silicon film. The controlled intensity distribution in turn leads to the controlled temperature distribution which promotes the crystal growth in the lateral direction. This known process is laser annealing with CW laser.

There has been reported a process of irradiation through a phase-shifting mask, in Jpn. J. Appl. Phys. Vol. 38 (1999), pp. L110–112. This process has a disadvantage of giving the phase-shifting pattern which has only one raised and lowered step instead of cyclic steps. As a result, the varying beam intensity gives a non-cyclic pattern on the sample surface and the part with a low intensity remains amorphous. Thus, rendering a sample polycrystalline completely by means of this mask necessitates repeating irradiation on amorphous parts.

There has been disclosed in JP-A No. 82669/2000 a process of forming polycrystalline silicon film for solar cells. This process is premised on coherent light of plane wave and is designed to convert amorphous silicon into polycrystalline silicon by irradiation with a laser beam through a phase-shifting mask having a cyclic pattern. The disadvantage of this process is that crystallization may be incomplete for tiny crystals in the region where the intensity of irradiation is low.

There has also been disclosed in JP-A No. 306859/2000 a process for irradiation through a cyclic slit or a cyclic phase-shifting patterned mask. This process has the same disadvantage as mentioned above. That is, tiny crystals remain in the region where the intensity of irradiation is low.

There has been disclosed in U.S. Pat. No. 6,322,625 and U.S. Pat. No. 6,368,945 and Lamda Physik Corporation's catalog (on Crystal as Optical System, January 2002) a process of irradiating a sample with a laser beam through a mask having a slit pattern which produces a binary pattern intensity distribution. This process, called Sequential Lateral Solidification (SLS) process, consists of repeated crystal growth in the lateral direction in the film by partial laser irradiation and melting to give large crystals. According to this process, the first cycle of irradiation leaves unirradiated regions cyclically and the second cycle of irradiation is carried out with accurate aiming at them There is disclosed in Jpn. J. Appl. Phys. Vol. 31 (1992) pp. 4545–4549 a process for irradiation with pulsed laser beams, thereby forming laterally grown crystal regions in a semiconductor film on a substrate. Described also therein is the morphology of the laterally grown crystals. The lateral crystal growth is accelerated by the temperature gradient due to device structure.

The prior art technologies mentioned above have disadvantages as follows. The process which involves forming a pattern on an amorphous silicon film is limited in throughput because it needs an additional step for pattern forming. The process for forming large crystal grains by irradiation with laser having a cyclically changing intensity distribution suffers the disadvantage of requiring repeated laser irradiation. This is because the first cycle of irradiation leaves some regions (where intensity is low) amorphous or merely forms tiny crystal grains (100 nm or less) due to insufficient energy and hence such incompletely crystallized regions need the second cycle of irradiation. The repeated irradiation needs an accurate stage as explained in the following. One cycle of laser irradiation gives rise to polycrystalline silicon grains whose particle diameter is 1 μm at most if the thickness of amorphous silicon film is 50 nm and the substrate is kept at room temperature. The second and ensuing cycles of irradiation to completely crystallize the remaining amorphous regions need a stage capable of position control accurate to 1 μm or less. Control in the height direction should also be considered in the case where a mask pattern is transferred to the sample surface through a lens so that a cyclic intensity distribution is produced. The pattern transfer is vulnerable to irregularities on the substrate surface on account of the small focal depth. The small focal depth arises from the fact that the lens to achieve an in-plane resolution of about 1 μm needs a lens with a large numerical aperture (NA). In order to ensure a certain focal depth, it is necessary to reduce the area to be irradiated at one time. This in turn makes it necessary to increase the number of frequencies of scanning. For example, in the case of SLS process that employs a lens having a high resolution of 1 μm or less, it is necessary to repeat scanning 30 times to irradiate the entire surface of a substrate measuring 900 mm in width because one region that is covered by irradiation is 30 mm wide. The foregoing is a hindrance to increasing the throughput of the laser annealing process.

SUMMARY OF THE INVENTION

The present invention was completed in view of the foregoing. It is an object of the present invention to provide a process for efficiently forming a silicon thin film in large area composed of uniform crystal grains whose crystallinity is close to that of single crystals. This object is achieved by the following improvements.

(1) Use is made of a phase-shifting mask having a periodic pattern scribed at a pitch smaller than four times the maximum particle diameter achievable by crystal growth with one cycle of irradiation. (The maximum particle diameter is about 1 μm in the case where the amorphous silicon film is 50 nm thick and irradiation is performed on the substrate kept at normal temperature.) Irradiation in this manner is illustrated in FIG. 1. The letter "E" in FIG. 1 indicates that the energy level for irradiation is higher than the threshold value of energy required to bring about crystallization throughout the entire thickness. It is to be noted from FIG. 1 that crystals grow as follows in each cycle of intensity distribution. That is, crystallization takes place first in the part where the energy level is low. (This energy level corresponds to the minimum value of the periodic intensity distribution.) With the lapse of time, the crystal growing position moves gradually toward the part where the energy level is higher. If the minimum energy level is kept higher than a certain value, the resulting crystals would have a particle diameter equal to about one half of the period of the intensity distribution over the entire region of irradiation. In contrast, if the minimum energy level of the intensity distribution is excessively low, crystal growth takes place first at the part where the energy level is higher than the minimum energy level. The result is that there remain regions in which crystallization is incomplete. In order to obviate the necessity of an accurate stage, it is necessary that crystals in the irradiated regions have a large particle diameter and there remain no regions with incomplete crystallization. (Accurate positioning is not necessary unless each shot of irradiation is directed to regions with incomplete crystallization.) This is the difference between the process of the present invention and the conventional SLS process. Incidentally, the restriction "four times" mentioned above arises from the fact that single crystals grow at four places in one cycle. The particle diameter of crystal grains is proportional to the length of period in which temperature decreases and crystals grow. This period depends on the duration of laser pulse, which ranges from 25 ns to 300 ns.

(2) Use is made of an incoherent optical system. Examples of this optical system include shaped linear beam and homogenized beam. Their use is necessary for reasons explained below. In the proximity method that employs a periodic phase-shifting mask, coherent laser beams give a complex intensity distribution with some peaks (as shown in FIG. 2) in place of a simple periodic intensity distribution. One way to eliminate this drawback is by using a homogenizing optical system, in which one laser beam is divided into more than one and each of the divided beams is shaped into a linear beam and finally linear beams are combined together. In this way it is possible to homogenize the intensity in the beam. If this optical system is placed before the mask, it produces a plurality of linear beams entering the mask at different phases and angles. Such linear beams have a simple intensity distribution in place of a complex one with peaks. This simple distribution is schematically illustrated in FIG. 3. This illustration is verified by electron microscopic observation of a sample which has been prepared by irradiating a substrate with laser beams through a periodic phase-shifting mask placed after the linear beam shaping and homogenizing optical system. The result of observation is shown in FIG. 4, which is an electron micrograph taken by a scanning electron microscope. The sample for observation was prepared by irradiating an amorphous silicon film with one shot of laser beam (specified below) through a periodic phase-shifting mask with a stripy pattern scribed at a pitch of 2 μm. The laser beam is a pulsed excimer laser beam having a wavelength of 308 nm and a pulse duration of 25–30 ns. The whitish parts in the electron micrograph represent hillocks and correspond to the peaks in the intensity distribution in FIG. 3. Hillocks occur as the edges of growing crystals crash against each other. A crystal nucleus consists of two regions, one in which the single crystal expands in both directions, and one in which the single crystal is cut by the grain boundary. No hillocks occur in this region. This part differs in appearance from the crystal formed by the SLS method. The mask with a periodic pitch of 2 μm gives rise to single crystals having a particle diameter which is at least 0.5 μm (one quarter of the pitch). Hence there exists no incompletely crystallized region between single crystals. The above-mentioned means forms those crystals which are characterized by hillocks (higher than their surrounding) in a linear row, with their average size (in the direction perpendicular to the row) being about one half of the distance between hillocks. In other words, FIG. 3 should be interpreted to mean that the trough of the intensity distribution corresponds to the crystal nucleus and the crystal grows toward the crest of the intensity distribution. And, hillocks occur at the part where the edges of the growing crystals crash against each other. The average particle diameter of the crystal is one quarter of the mask pitch and one half of the distance between hillocks. Crystal growth in this manner obviates the necessity of repeated irradiation of the incompletely recrystallized region, and this contributes to improvement in throughput. The linear beam shaping and homogenizing optical system produces a light intensity distribution such that the minimum value is not zero on the sample surface and hence does not leave incompletely recrystallized regions. The minimum value of the light intensity distribution can be controlled by varying the intensity of laser beam incident to the mask or by varying the phase difference of the phase-shifting mask. It is established higher than the value which will not leave incompletely crystallized regions.

(3) Use is made of an optical system to produce a linear beam. The reason for this is that the phase-shifting mask with a periodic stripy pattern (as specified in the present invention) effectively simplifies the intensity distribution when used in combination with the linear beam shaping and homogenizing optical system. The optical system is exemplified by the homogenizing optical system for the laser annealer, available from The Japan Steel Works, Ltd. The linear beam is also used for the ordinary laser annealer that draws on the uniform light intensity distribution. It offers the advantage of reducing the number of cycles of scanning. A disadvantage of linear beam is that the region irradiated with beam ends (in which light intensity is low) tend to become incompletely crystallized. Fortunately, this disadvantage can be eliminated by extending the long axis of the linear beam. In this way it is possible to reduce the incompletely crystallized region that occurs at the overlapped part of scanning. The electron micrograph in FIG. 4 represents a portion of crystals produced by irradiation with a linear beam having a long axis of 365 mm and a short axis of 400 μm. It demonstrates the lateral crystal growth by the linear beam. The foregoing has been realized by the apparatus shown in FIG. 13. This apparatus consists of the laser annealing unit (of The Japan Steel Works, Ltd.) including the homogenizing optical system and the phase-shifting mask with a periodic stripy pattern. The length established by this is more than 33.5 mm which corresponds to the shorter side of an image display device having a diagonal size of 2.2 inches.

(4) Laser irradiation is accomplished in such a way that a certain space is retained between the sample and the mask, without any lens placed therein. The reason for this is explained below. The mask has a pitch of order of micrometers, and the lens to resolve this pitch has a short focal depth. Such a lens is vulnerable to substrate irregularities and vibrations, and hence unsuitable for efficient annealing. Any lens immune to the surface irregularities of the substrate being continuously moved by the stage should have a focal depth of more than tens of micrometers. In the case of the proximity method, which uses no lens, the distance between the mask and the sample depends on the pitch of the mask pattern, with no arbitrary values allowed. In fact, the present inventors found that the optimal distance is a multiple of 0.6 mm for a pitch of 2 μm and a multiple of 0.9 mm for a pitch of 3 μm. Unless this condition is satisfied, the periodic intensity distribution is not obtained as desired. It was also found that the margin of the optimal distance is ±30 μm. This implies that the apparatus should have a mechanism to keep the mask-sample distance with an accuracy of ±30 μm.

(5) Direction of the stripy pattern. The phase-shifting mask should have its stripy pattern arranged approximately parallel to the scanning direction and perpendicular to the long axis of the linear beam. The reason for this is given below. The stripy pattern (consisting of raised and lowered parts) on the phase-shifting mask brings about diffraction in the direction perpendicular thereto. When this direction approximately coincides with the long axis of the linear beam, the diffracted light superposes each other, contributing to the intensity distribution, and the high efficiency is achieved. (In this case, there is a minimum amount of light escaping from the effective irradiating region right under the stripes.) This holds true only when the stripes are approximately parallel to the scanning direction and approximately perpendicular to the long axis of the linear beam. The direction of the stripy pattern will be discussed in more detail in the following.

(6) Method for reducing the height of hillocks of crystals. Crystals formed by one shot of irradiation have regions with high hillocks as shown in FIG. 4, and such regions appear at intervals equal to one-half the pitch of the mask pattern. Such hillocks adversely affect the device (for example, causing dielectric breakdown to the gate insulating film of the thin-film transistor), and hence their reduction is desirable. The region of hillocks which is formed by the first shot of irradiation corresponds to the peak position of the light intensity distribution; therefore, the second shot of irradiation should be carried out such that the peak position of the light intensity distribution is displaced from the region of hillocks. In this way it is possible to reduce hillocks. The amount of this displacement should be less than 1 μm. This object is achieved with an ordinary stage whose positioning accuracy is about 5 μm if scanning is carried out in the following manner.

FIG. 5 shows the relation among the angle (θ) between the scanning direction and the direction of the stripy pattern of the phase-shifting mask, the distance (S) over which the substrate stage moves in pulse interval, and the displacement (d) of the peak of light intensity which occurs in pulse interval. The direction of crystal growth is perpendicular to the direction of the stripy pattern, and the position where hillocks are high is displaced by an amount of d=S tan θ. This figure shows the situation in which S is one half of the short axis L of the linear beam or in which laser annealing is accomplished by overlapped irradiation with two shots. In the area where the first shot overlaps with the second shot, hillocks are lower than those in the unoverlapped region. A probable reason for this is as follows. The first-shot irradiation is directed to amorphous silicon for its complete melting, whereas the second-shot irradiation (and subsequent irradiation) is directed to polysilicon. And, polysilicon melts only partly and hence the amount of silicon that moves to form hillocks is less than that results from the first-shot irradiation. Repeating pulse irradiation for the third and fourth shots, with the substrate being continuously moved, efficiently gives rise to a polysilicon thin film of large area having hillocks not higher than 60 nm and having no residual amorphous silicon region. FIG. 6 graphically shows the dependence on angle of the rate of stage movement and the amount of displacement. It is assumed that the laser pulse repeats itself at a frequency of 300 Hz. If the stripy pattern of the phase-shifting mask has a pitch of P μm, then the interval of hillocks formed by each shot is P/2 μm. Therefore, it is desirable that the amount (d) of displacement be smaller than P/2 times 1/(number of overlapping shots). To this end, it is desirable to carry out laser irradiation at an angle which results in the amount (d) of displacement outside the above-mentioned range, while keeping the number of overlapping shots constant or the rate of substrate scanning constant. This is because the particle diameter of crystals varies depending on the number of overlapping shots and hence it is desirable to fix the number of overlapping shots. It is noted from FIG. 6 that the setting of angle ranges from 0.1 to 2 degrees for the practical scanning rate (3 to 60 mm/s). The above-mentioned means permits one to produce a semiconductor thin film characterized by the following. Hillocks higher than the surroundings form in line. The average size of crystals (measured in the direction perpendicular to the line of hillocks) is larger than 0.4 μm. There is an angle of 0.1 to 2 degrees between one side of the substrate on which the polycrystalline silicon film is formed and the direction of the line of hillocks. Moreover, laser annealing by the above-mentioned means causes hillocks to form in line which are higher than the surroundings and lines of hillocks exist periodically, with the average distance between them varying. This is seen from the state of crystallization in the region in which the first irradiation overlaps with the second irradiation, as shown in FIG. 5. Thus, it is possible to form a semiconductor thin film which is characterized in that there exist no amorphous region between hillocks. FIGS. 17, 18, and 19 respectively show the array of hillocks resulting from one-shot irradiation without overlapping, two-shot irradiation with overlapping, and four-shot irradiation with overlapping. The above-mentioned method may be applied to the slit SLS method which employs the periodic pattern.

Another method for reducing hillocks is mentioned in the following. Annealing is carried out first by using the mask, and then ordinary pulse irradiation is carried out, to reduce hillocks, without the mask or by using that part of the mask which is not patterned. FIG. 7 is an electron micrograph (taken by a scanning electron microscope) of the crystals which have been obtained by a first shot of irradiation through a phase-shifting mask having a stripy pattern scribed at a pitch of 2 μm and a second shot of irradiation without the mask. It is noted that the sample shown in FIG. 7 has particle diameters of about 0.5 μm in two directions whereas the sample shown in FIG. 4 has particle diameters of about 0.5 µm only in one direction perpendicular to the stripy pattern of the mask. The effect of the above-mentioned procedure is that the height of hillocks decreases from 90 nm to 70 nm (in terms of PV value) This effect is more remarkable as the number of shots of irradiation without the mask increases.

(7) Method of irradiation. According to the process of the present invention, one shot of pulse irradiation is enough for complete conversion of amorphous into crystalline within the irradiated region covered by the width of the laser beam. This obviates the necessity of taking accurate aim in the subsequent pulse irradiation. Therefore, it is not necessary for the stage to have a feeding accuracy of about 1 µm. In addition, the process of the present invention does not use the transfer system which needs a lens having a large NA for resolution of several micrometers in irradiation with a periodic intensity distribution of several micrometers. This eliminates the necessity of auto-focusing with a precision of several micrometers at each time of shot because the gap has a large margin. Experimental results indicate that the height margin is ±30 µm. This large margin reduces the effect due to up and down vibration and variation of substrate thickness.

For reasons mentioned above, the mask according to the present invention can be incorporated as such into the ordinary laser annealing apparatus. For example, it can be built into the laser annealing apparatus (made by The Japan Steel Works, Ltd.) which has been developed for annealing with the ordinary uniform light intensity distribution. The linear beam in this case measures 365 mm in long axis and 400 µm in short axis. The mask designed for this particular apparatus measures 400 mm long and 20–50 mm wide. The advantage of using a linear beam is that a wide area can be annealed by one scanning. Scanning with a linear beam for annealing may be accomplished in the direction as shown in FIGS. 8 and 9. Scanning may also be accomplished in mutually perpendicular directions as shown in FIG. 10. The advantage of this scanning method is that crystals grow in two directions and hence the resulting crystals have large particle diameters extending in two dimensions. Such crystals provide high mobility in any direction.

The following is concerned with parallelism of the scanning direction to the side of a substrate. It is assumed that a linear beam is scanned in the direction approximately parallel to the long side of a glass substrate measuring 730 mm by 920 mm. If the linear beam is aslant 0.1 degree with respect to long side of the glass substrate, scanning over a distance of 900 mm causes a displacement of 2 mm to occur in the short side. This means that an area of 4 mm is left unirradiated at both short sides of the substrate. In addition, usually the amorphous silicon film is thin in the peripheral region of the substrate. The thin region is about 10 mm from the edges of the substrate, depending on the performance of the CVD apparatus used to form the amorphous silicon film. Thus, the region of about 14 mm from the edges of the substrate is wasted. Common practice to minimize the wasted area is to make the angle between the scanning direction and the side of the substrate smaller than 0.1 degree. Moreover, it is also common practice to ensure parallelism when a large single substrate is cut into many small semiconductor devices. Therefore, the direction of scanning should have an accuracy within 0.1 degree with respect to one side of a large substrate and a small cut device. Thus, it is not necessary to distinguish between the direction of scanning and the direction of one side of the substrate. By combining the above-mentioned means (1) to (7), it is possible to form a semiconductor thin film which is characterized by the following.

The semiconductor thin film has hillocks in line which are higher than the surroundings.

The hillocks have an average size larger than 0.4 µm measured in the direction perpendicular to the direction of their line.

The direction of hillocks' line is aslant 0.1 to 2 degrees with respect to one side of the substrate on which polysilicon film is formed.

The above-mentioned means may also be applied to the slit SLS method which employs the periodic pattern.

(8) Measure to prevent the sticking of silicon vapor. A laser beam used for crystallization by laser annealing has energy sufficient to melt and even evaporate silicon. The resulting silicon vapor sticks on the mask, thereby reducing the intensity of laser beam and hampering crystallization. Thus, it is necessary to introduce a measure to prevent the sticking of silicon vapor. This object is achieved by forming a gas flow in the vicinity of the mask surface, as shown in FIG. 11. It is desirable to use the same kind of gas as introduced into the laser annealing chamber so that the gas flow does not adversely affect crystallization. The above-mentioned means may also be applied to the slit SLS method which employs the periodic pattern.

(9) Increasing the process margin against the fluctuation of laser intensity. When a laser used for irradiation through a patterned mask has an excessively low intensity, there occurs an undesirable situation in which the irradiated region where the intensity is lowest remains amorphous. Such a situation can be avoided by repeating irradiation twice, the first one without a mask and the second one with a mask. In this way crystallization takes place throughout the irradiated region regardless of the intensity distribution, and hence there remain no amorphous regions or microcrysalline regions.

(10) Mask patterns that can be used in common for the proximity method. The mask with a periodic stripy pattern is under restrictions by the relationship between the stripe pitch and the gap when it is used for the proximity method. For a phase-shifting mask having a stripy pattern, the gap should be a multiple of 0.6 mm or 0.9 mm if the pattern pitch is 2 µm or 3 µm, respectively. This means that either of the two pitches (2 µm and 3 µm) can be used if the gap is 1.8 mm. In other words, the pitch of the periodic stripy pattern should be a multiple of 1 µm, if it is to be applied to the same gap. The pattern meeting the above-mentioned requirements permits one to produce a polycrystalline semiconductor thin film which is characterized in that hillocks form in line which are higher than the surroundings, there are regions in which the array of hillocks has different periodicity, and the periodicity of array is a multiple of the gap. The above-mentioned means may also be applied to the slit SLS method which employs the periodic pattern.

(11) Arrangement of elements in a device. The process according to the present invention yields crystals whose particle diameters are oriented in one direction. Since the carrier mobility is large in this orienting direction, the resulting transistor has improved characteristics if the source-drain direction is made to coincide with this direction. It is possible to make the source-drain direction incline 0.1–2 degrees with respect to one side of the substrate if the above-mentioned method for reducing the height of crystal hillocks is combined with the above-mentioned scanning method. If the source-drain direction is perpendicular to the crystal growth direction, the resulting transistor is poor in characteristics. For transistors in which there are mutually perpendicular source-drain directions, it is possible to cancel out each other different characteristics due to different source-drain directions if the scanning direction is aslant about 45 degrees with respect to the crystal growing direction.

(12) Application to SOI structure. The SOI (silicon on insulation) structure is composed of a single-crystal silicon wafer and each of oxide film and silicon film sequentially formed thereon. It is obtained by three steps as follows. Heat treatment on the surface of a silicon wafer to cover it with a thermal oxide film about 5 μm thick. Chemical vapor deposition (CVD) to deposit an amorphous silicon film on the oxide film. Laser annealing of the amorphous silicon by the process of the present invention. These steps do not require lamination. Incidentally, the thermal oxide film mentioned above may be replaced by a CVD oxide film. The thus formed SOI structure is used to fabricate semiconductor devices.

By using the above-mentioned means, it is possible to produce a semiconductor device which is characterized by the following.

The substrate on which the semiconductor device is formed has an uppermost layer of polycrystalline silicon. The polycrystalline silicon film has hillocks in line which are higher than the surroundings.

The hillocks have an average size larger than 0.4 μm measured in the direction perpendicular to the direction of their line.

The direction of hillocks' line is aslant 0.1 to 2 degrees with respect to one side of the substrate on which the polycrystalline silicon film is formed.

In addition, by using the above-mentioned means, it is also possible to produce a semiconductor device which is characterized by the following.

The substrate on which the semiconductor device is formed has an uppermost layer of polycrystalline silicon. The polycrystalline silicon film has hillocks in line which are higher than the surroundings.

The average particle diameter measured in the direction perpendicular to the direction of line is larger than the intervals of the hillocks.

(13) Laser annealing with CW laser is explained below. It is possible to form a polycrystalline thin film composed of large crystals grown in the lateral direction without the necessity of forming a patterned antireflection film on an amorphous silicon film if an amorphous silicon film formed on a glass substrate is irradiated (by scanning the glass substrate) with CW laser (in the form of linear beam) through a phase-shifting mask having a periodic stripy pattern. In this case, the stripy pattern of the phase-shifting mask should preferably be oriented in the direction approximately perpendicular to the direction of the long axis of the linear beam and also oriented in the direction approximately parallel to the scanning direction. The stripy pattern of the phase-shifting mask may have a larger periodicity than that used for the pulsed laser mentioned above. In practice, the periodicity may be one to tens of micrometers. The reason for this is that scanning with CW laser is more flexible than scanning with pulsed laser for adjustment of the length of time in which molten silicon cools for crystal growth. Scanning with CW laser also needs as accurate control over the mask-sample gap as in scanning with pulsed laser. The direction of scanning should be aslant a certain angle with respect to the direction of the stripy pattern of the phase-shifting mask. If this angle is zero and the minimum value of intensity distribution is insufficient for crystallization, the amorphous silicon film remain amorphous or microcrystalline along the direction of scanning. In order to avoid this situation, it is necessary to make a certain angle between the direction of scanning and the direction of the stripy pattern of the phase-shifting mask. This angle (θ) should be determined so that sin θ>P/(2W) is satisfied, where W denotes the width of the short axis and the P denotes the pitch of the stripy pattern. Scanning in this manner causes the insufficiently crystallized region to overlap with the sufficiently crystallized region and hence eliminates the insufficiently crystallized region.

The CW laser should have a wavelength of 532 nm, preferably shorter than this, because silicon absorbs laser light more easily and melts with less energy as wavelengths decrease. The CW laser that can be used in this process is YAG laser having wavelengths of 532 nm and 266 nm as the second and higher harmonics or Ar-ion laser having a wavelength of 488 nm or 514.5 nm.

DETAILED DESCRIPTION OF THE PREFERRED EMBODIMENTS

The invention will be described in more detail with reference the following examples.

EXAMPLE 1

Figure 1:
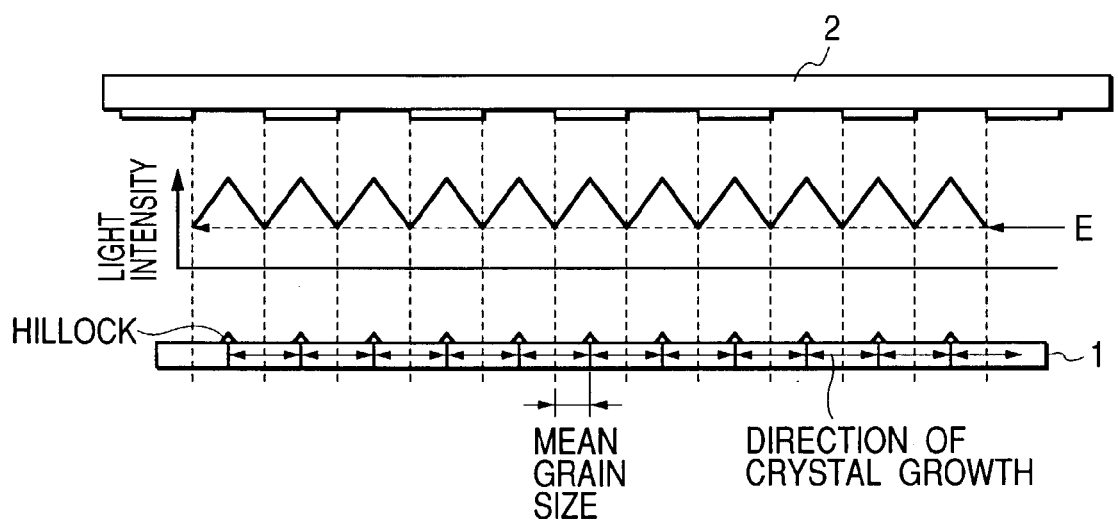
FIG. 1 is a diagram showing how crystallization takes place by one-shot irradiation when the mask pattern is used according to the present invention.
Figure 2:
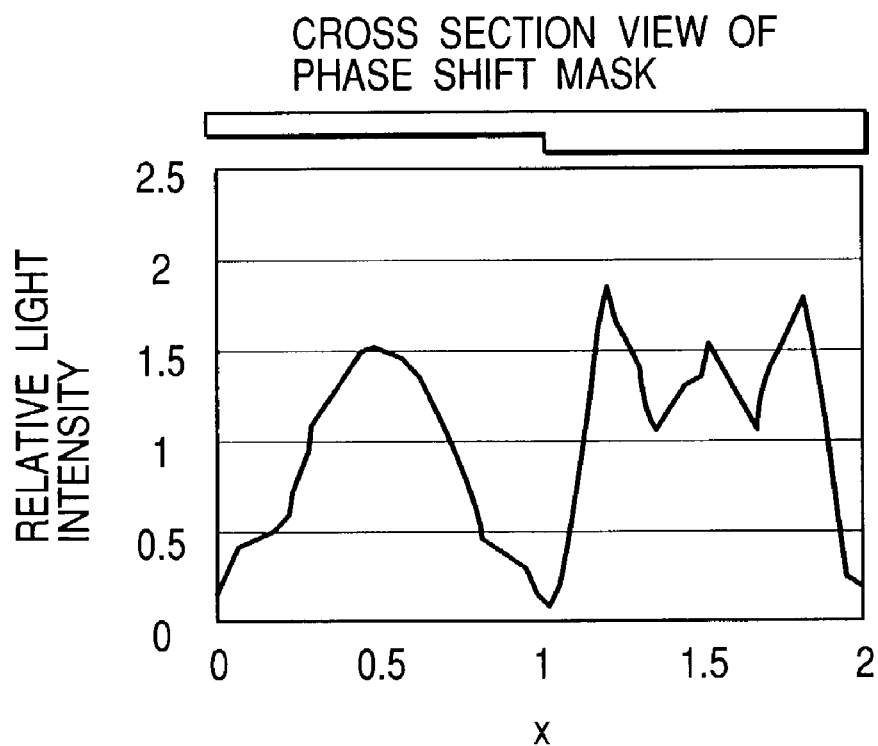
FIG. 2 is a diagram showing the result of numerical analysis of the intensity distribution in the case of irradiation with coherent light through a mask pattern.
Figure 3:
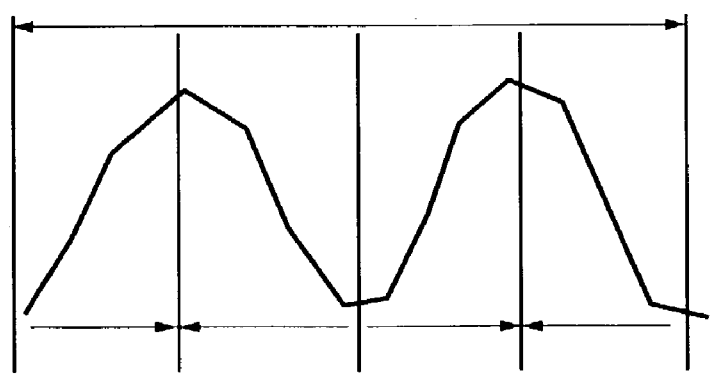
FIG. 3 is a schematic diagram showing the intensity distribution in the case of crystallization (according to the present invention) by irradiation with incoherent light through a mask pattern.
Figure 4:
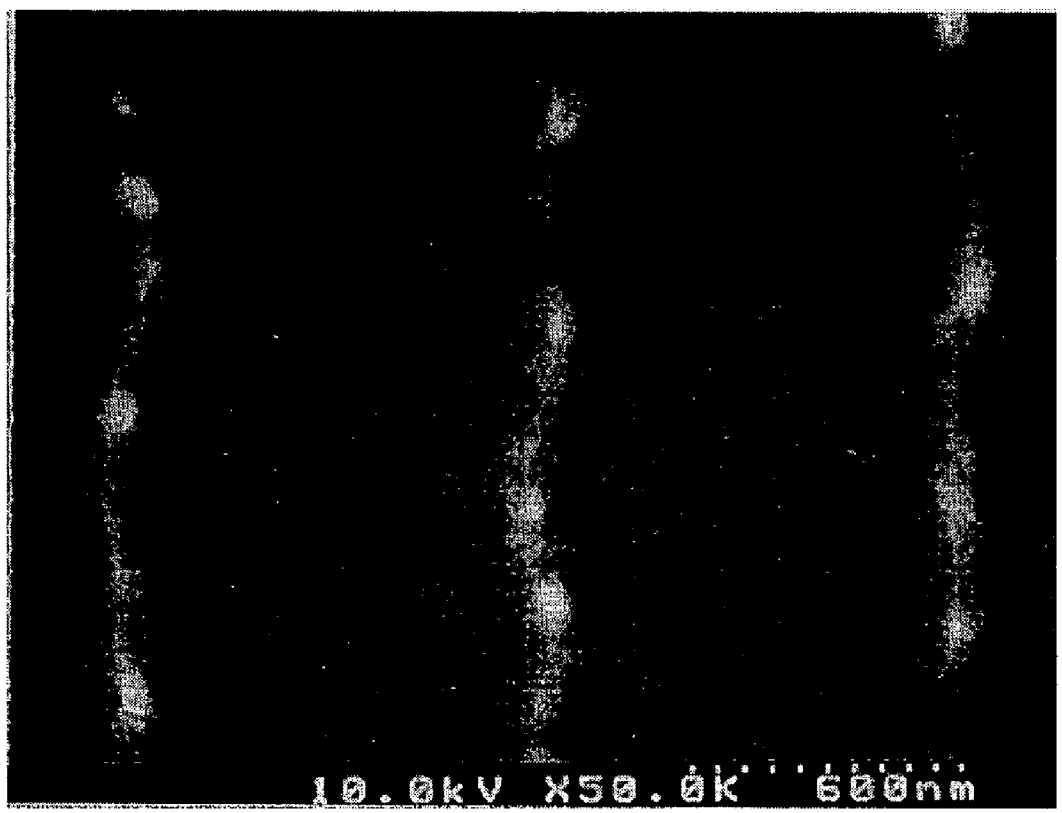
FIG. 4 is an electron micrograph (taken by a scanning electron micrograph) of crystals formed by one-shot irradiation according to the present invention.
Figure 5:
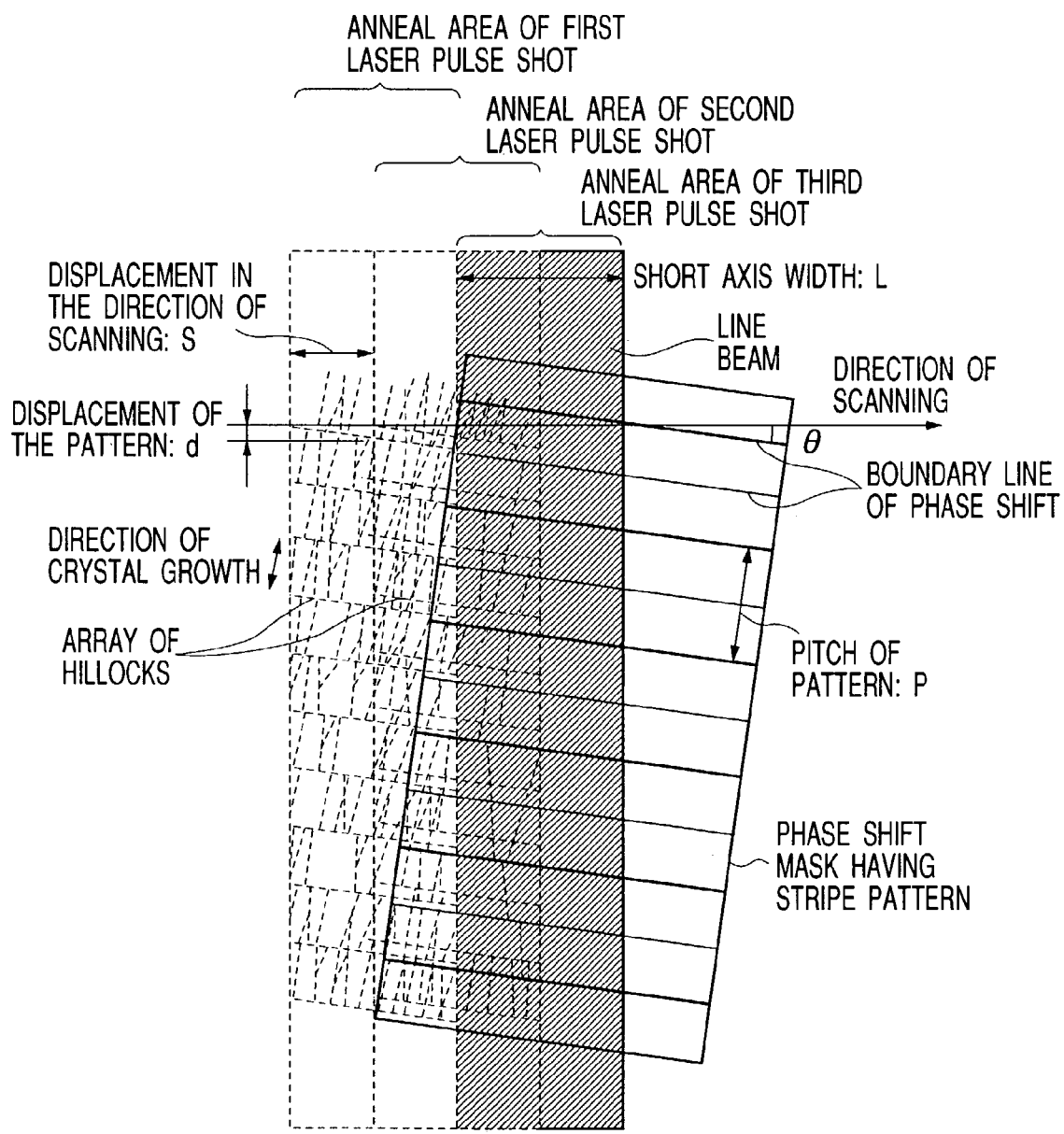
FIG. 5 is a schematic diagram showing the relation among the scanning direction, mask pattern, and laser beam in the present invention.
Figure 13:
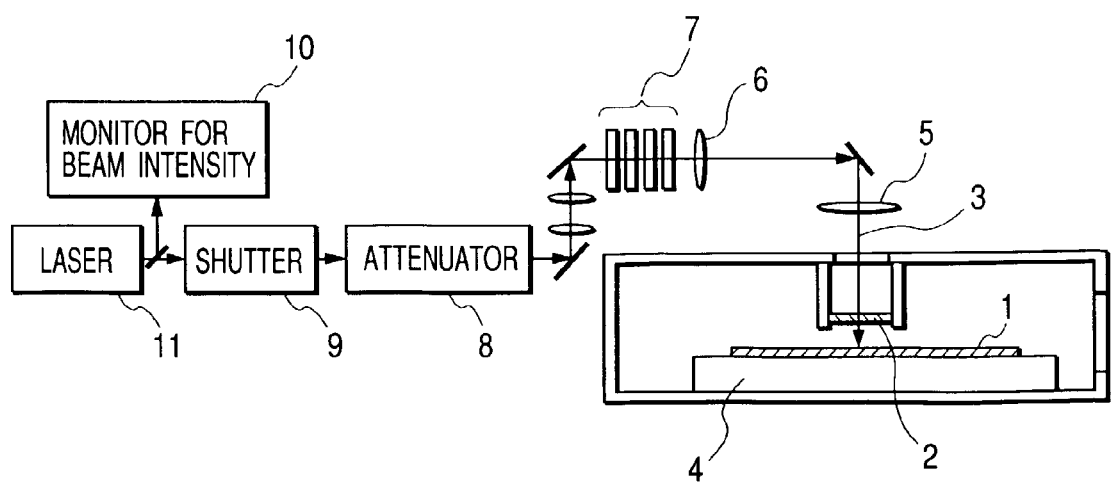
FIG. 13 a diagram showing an example of the apparatus used for crystallization according to the present invention.

The laser annealing process according to the present invention is accomplished by using an apparatus shown in FIG. 13. There is shown a sample substrate 1 having an amorphous silicon film formed thereon. There is also shown a mask 2 which is placed 0.6 mm above the substrate 1. This mask is a periodic phase-shifting mask with a stripy pattern scribed at a pitch of 2 μm. (An enlarged side view of the substrate 1 and the mask 2 is shown in FIG. 1.) There is shown a pulsed laser beam 3 specified below.
XeCl Excimer Laser Generated by Model STEEL 1000 of Lamda Physik Corporation.
Wavelength: 308 nm
Pulse intervals: approx. 27 ns
Repeating frequency: 300 Hz The laser beam 3 is shaped into a linear beam, 365 mm in long axis and 400 μm in short axis, by an optical system consisting of a homogenizer 7 (from Micro Las Corporation) and cylindrical lenses 6 and 5. There is shown a substrate stage 4 which feeds the substrate at a prescribed rate during laser irradiation. The substrate stage 4 moves with a positioning accuracy of 5 μm. In the case of irradiation with two overlapping shots, the linear beam advances in one cycle of 300 Hz a distance equivalent to half the short axis of the linear beam (or 400 μm). For the linear laser beam to advance 200 μm within 1/300 seconds, the scanning rate should be 60 mm/s.

There is a sensor (not shown) to monitor the gap between the mask and the substrate. The sensor controls a piezo-actuator to keep the gap at 600±30 μm. The gap sensor and piezo-actuator are installed at both ends of the long axis of the mask jig.

Figure 8:
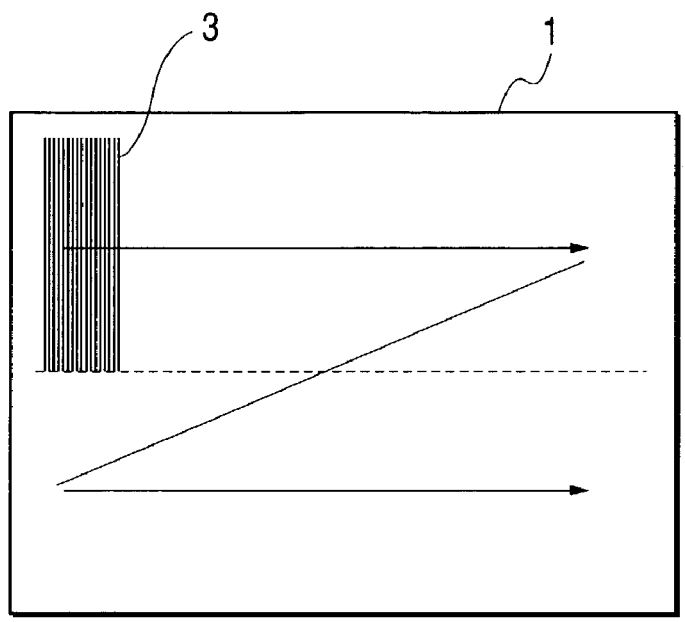
FIG. 8 is a diagram showing an example of the scanning method that can be used for crystallization in the present invention.
Figure 9:
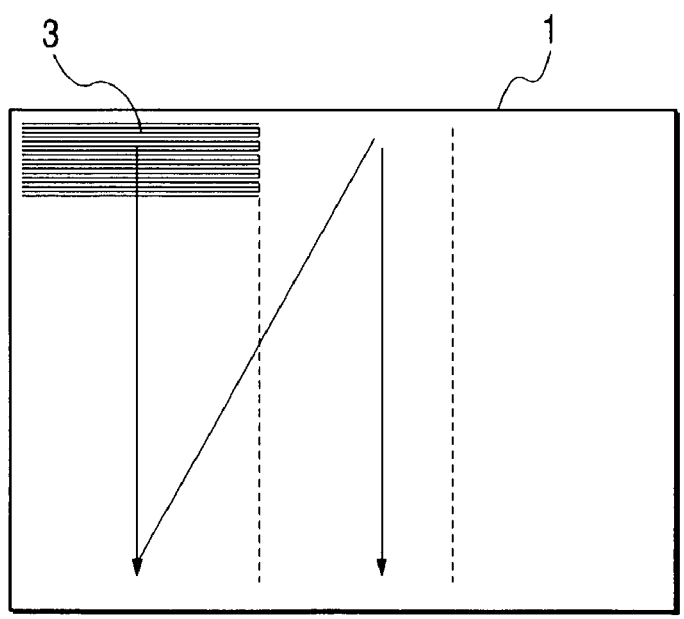
FIG. 9 is a diagram showing an example of the scanning method that can be used for crystallization in the present invention.
Figure 10:
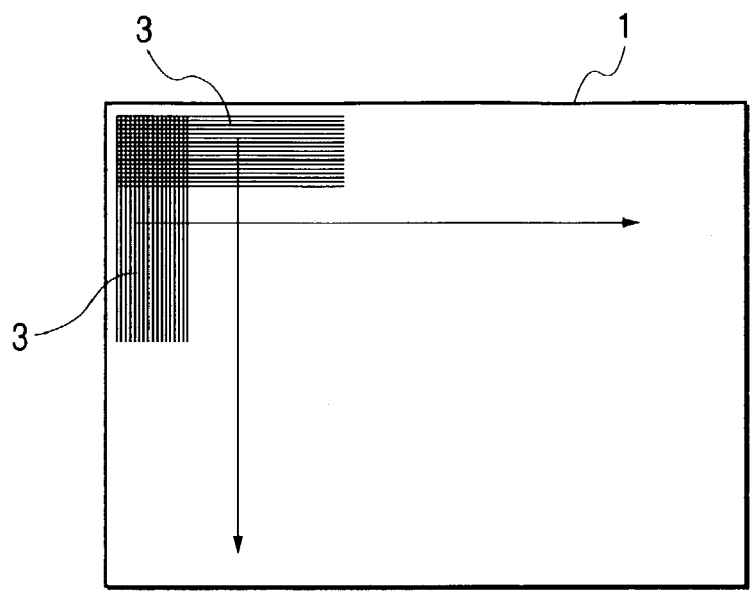
FIG. 10 is a diagram showing an example of the scanning method that can be used for crystallization in the present invention.

Scanning with the laser beam is carried out in parallel directions as shown in FIG. 8 or 9, or in mutually perpendicular directions as shown in FIG. 10.

Figure 6:
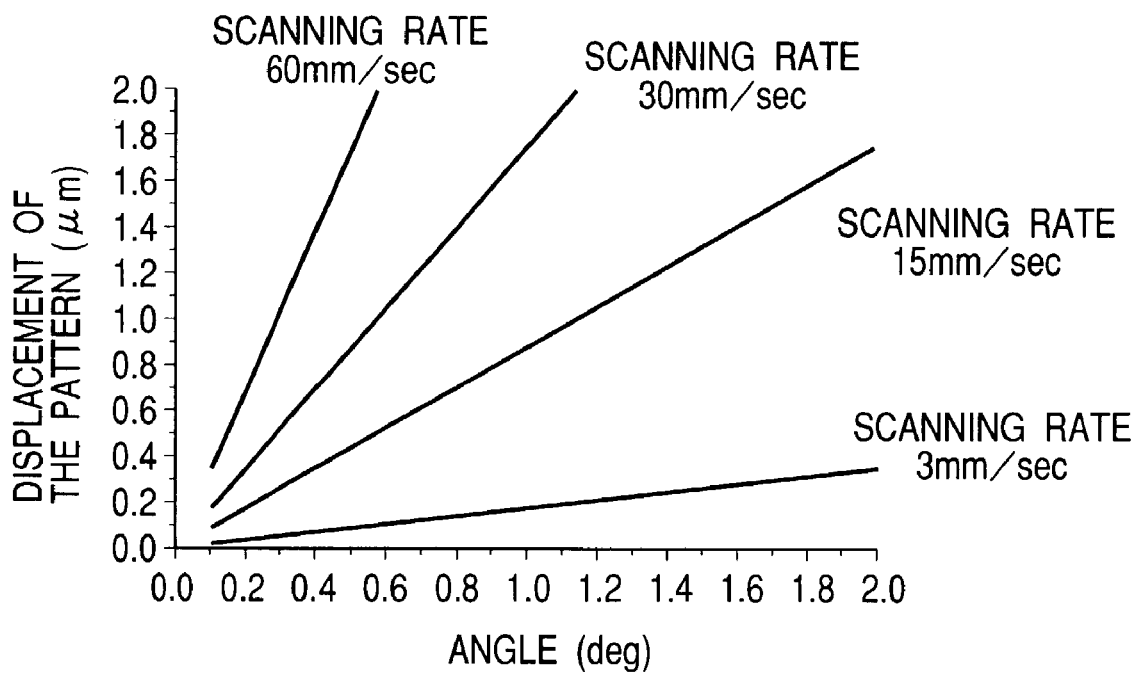
FIG. 6 is a diagram showing the relation among the angle between the scanning direction and the mask pattern and the rate of scanning in the present invention.
Figure 7:
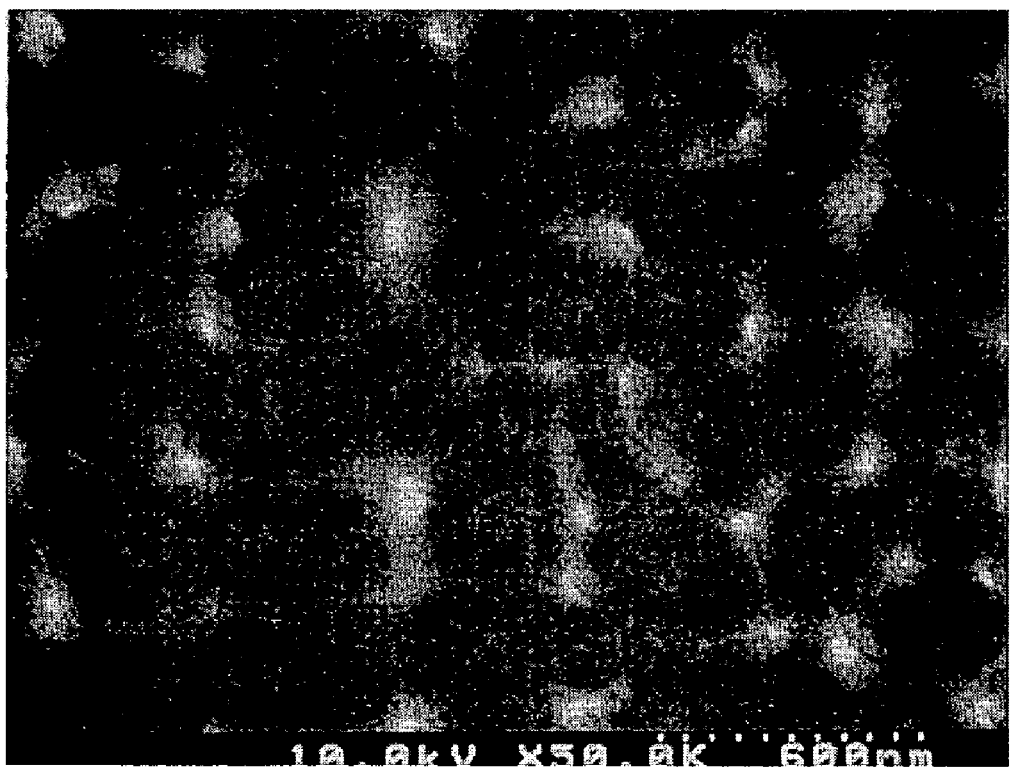
FIG. 7 is an electron micrograph (taken by a scanning electron microscope) of an example of the crystals formed according to the present invention.

The direction of scanning is aslant 0.15 degrees with respect to the direction of the stripy pattern of the mask. For the scanning rate of 60 mm/s, this angle causes the crystal pattern on the substrate to shift 0.5 μm, as shown in FIG. 6. This amount of shift is just adequate for the hillocks formed by the first shot to be reduced by the second shot, because hillocks occur at intervals of 1 μm in the case of scanning through a phase-shifting mask with a pitch of Annealing in the above-mentioned manner takes about 15 seconds for the entire surface of a substrate measuring 730 mm by 920 mm. This annealing is about 10 times as efficient as ordinary annealing by laser irradiation with a uniform intensity distribution, because ordinary annealing needs overlapped irradiation with 20 shots or more in order that the resulting crystal grains are larger than 0.3 μm. In addition, annealing in the above-mentioned manner offers the advantage of giving rise to larger crystal grains (0.5 μm), which should be compared with crystal grains (0.3 μm) in the case of ordinary annealing. Large crystal grains help increase the carrier mobility, thereby improving the device characteristics. Incidentally, the same result as mentioned above may be obtained even in the case where scanning is carried out in one shot (without overlaps) or in more than two shots (with multiple overlaps).

The pulsed laser to be used for annealing should meet the following requirements for wavelength and energy density.

{(Absorption coefficient of amorphous silicon at wavelength of concern)×(Reflectivity of amorphous silicon at wavelength of concern)}/{(Absorption coefficient of amorphous silicon at wavelength of 308 nm)×(Reflectivity of amorphous silicon at wavelength of 308 nm)}>380 mJ/cm².

For a laser beam with a fixed pulse energy, it is necessary to change the area of irradiation so that the energy density meets the above-mentioned requirements. The pulse intervals should preferably be 27 ns and above. In addition to the above-mentioned excimer laser, a solid-state laser with a wavelength of 532 nm or below can also be used.

EXAMPLE 2

This example uses the same equipment as in Example 1 but differs in the way of irradiation. In this example, irradiation may be carried out in two steps. Irradiation in the first step is through a mask pattern as with the foregoing embodiment, and no mask pattern is used for irradiation in the second step. Irradiation in this manner yields a thin film consisting of isotropic crystal grains and having low hillocks. Alternatively, irradiation may be carried out such that no mask pattern is used in the first step and a mask pattern is used in the second step. The effect of irradiation in this manner is that the second step (with a mask pattern) ensures crystallization at the part where the light intensity is very low. This effect permits the process to be run with low laser energy.

EXAMPLE 3

This example uses the same equipment as in Example 1 except for the phase-shifting mask in which the stripy pattern has a pitch of 3 μm. In this example, the mask is 0.9 mm away from the substrate and the rate of scanning is 30 mm/s for 4-shot overlapping. Scanning is carried out in a direction which is aslant about 0.17 degrees with respect to the mask so that the shift of the pattern is 0.2 μm as shown in FIG. 6. This is because the interval of hillocks is 1.5 μm and hence the shift should be smaller than 0.325 μm (1.5 μm divided by 4) for 4 shots on the same spot. Thus, repeating overlapping shots four times with a specific amount of shift reduces hillocks.

EXAMPLE 4

Figure 11:
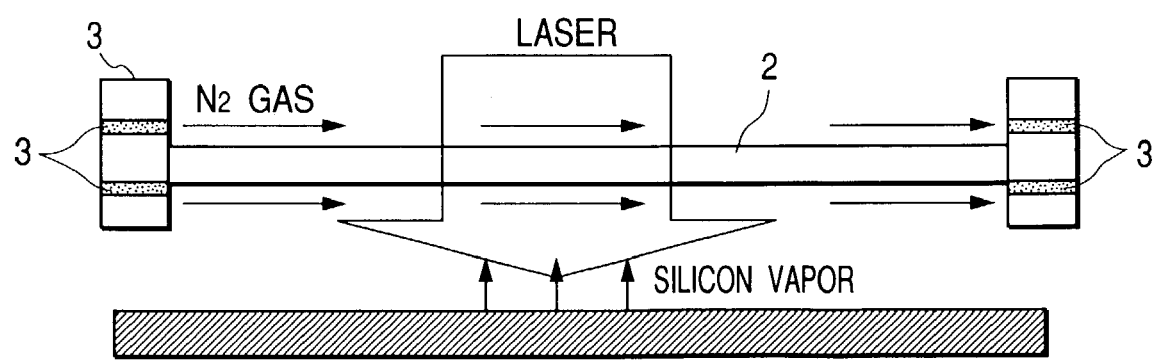
FIG. 11 is a schematic diagram showing how to cope with the clouding of the mask.
Figure 12:
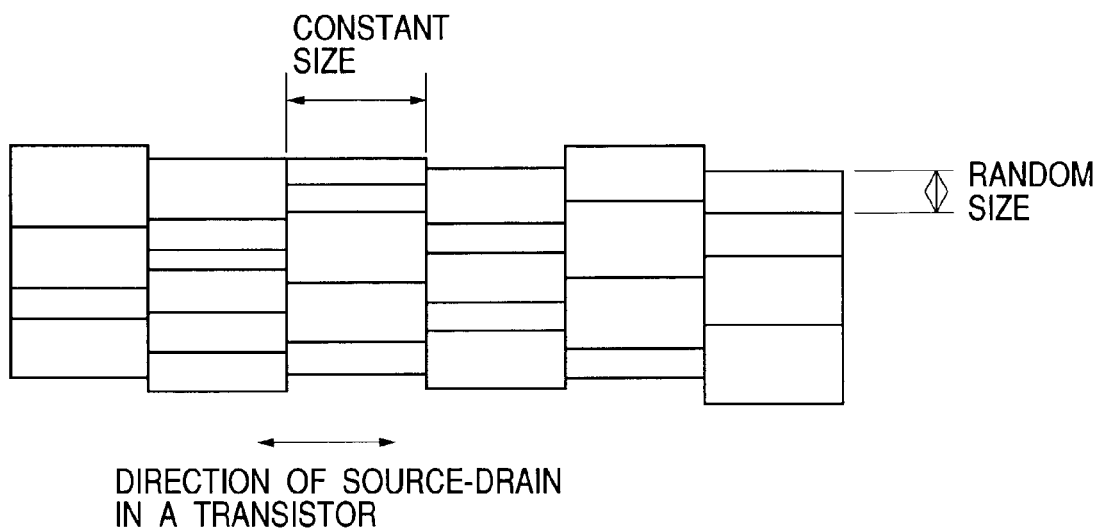
FIG. 12 is a diagram showing the relation between the direction of crystals and the source-drain direction of a thin-film transistor fabricated.
Figure 14:
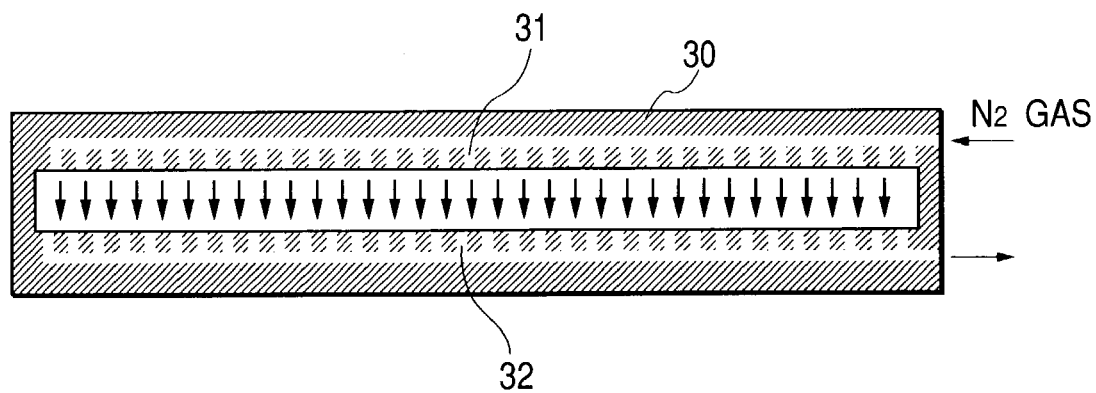
FIG. 14 is a schematic diagram showing how to cope with the clouding of the mask.
Figure 15:
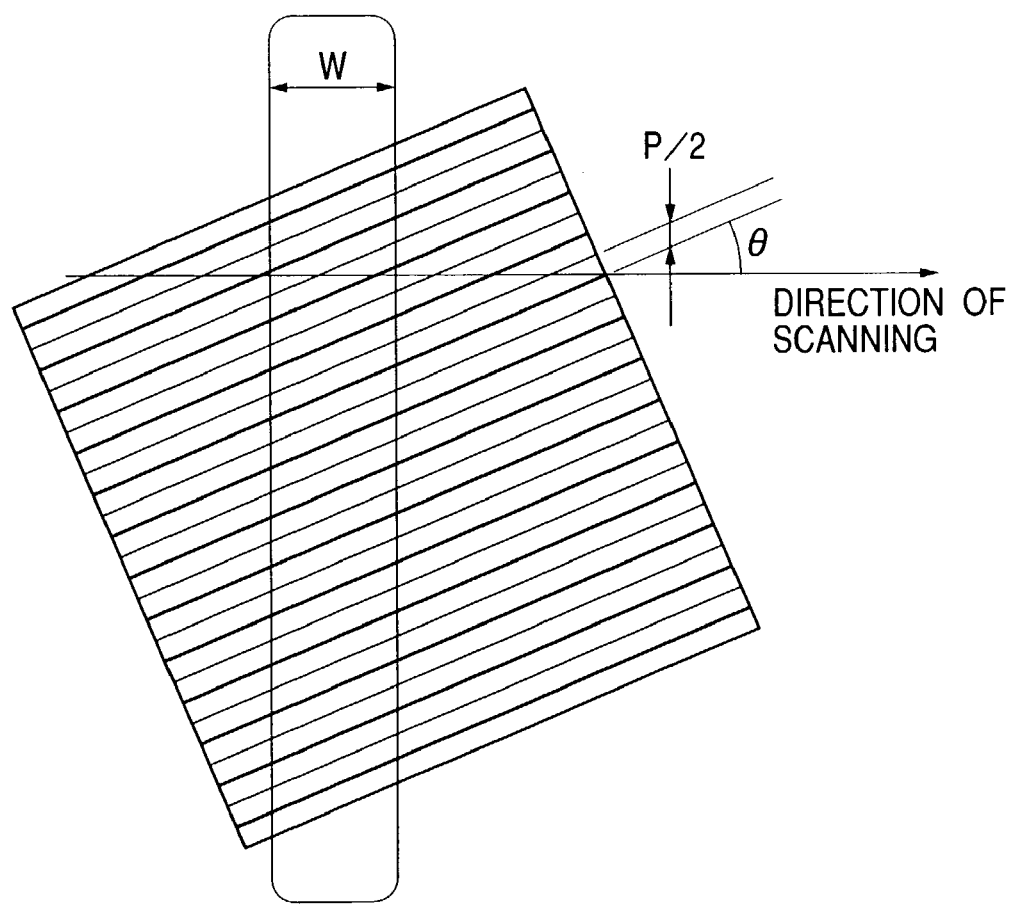
FIG. 15 is a diagram showing the relation among the beam width of CW laser, the stripy pattern of the phase-shifting mask, and the direction of scanning.

This example demonstrates how to protect the mask from being clouded with silicon vapor. (The mask is exposed to silicon vapor during irradiation.) The object is achieved by flowing nitrogen gas along the upper and lower surfaces of the mask 2, as shown in FIG. 11 (sectional view). The mask is held by a frame which has a number of holes to blow nitrogen gas from one side and a number of holes to suck nitrogen gas from the other side, as shown in FIG. 14 (plan view).

EXAMPLE 5

This example demonstrates a semiconductor device of SOI (silicon on insulator) structure which is produced as follows. A silicon substrate is coated with a thermal oxide film, 0.5 μm thick, on which is subsequently formed an amorphous silicon film, 50 nm thick, by CVD process. The amorphous silicon film is annealed by laser beam scanning (with two-shot overlapping) through a phase-shifting mask placed 0.6 mm away from the substrate. This mask has a stripy pattern scribed at a pitch of 2 μm. The foregoing steps are followed by the ordinary procedure to form transistors on the polysilicon layer resulting from annealing. Thus there is obtained the desired SOI device. Incidentally, the thermal oxide film mentioned above may be replaced by an oxide film formed by CVD process. The thickness of the oxide film is not restricted to 0.5 μm.

EXAMPLE 6

Figure 16:
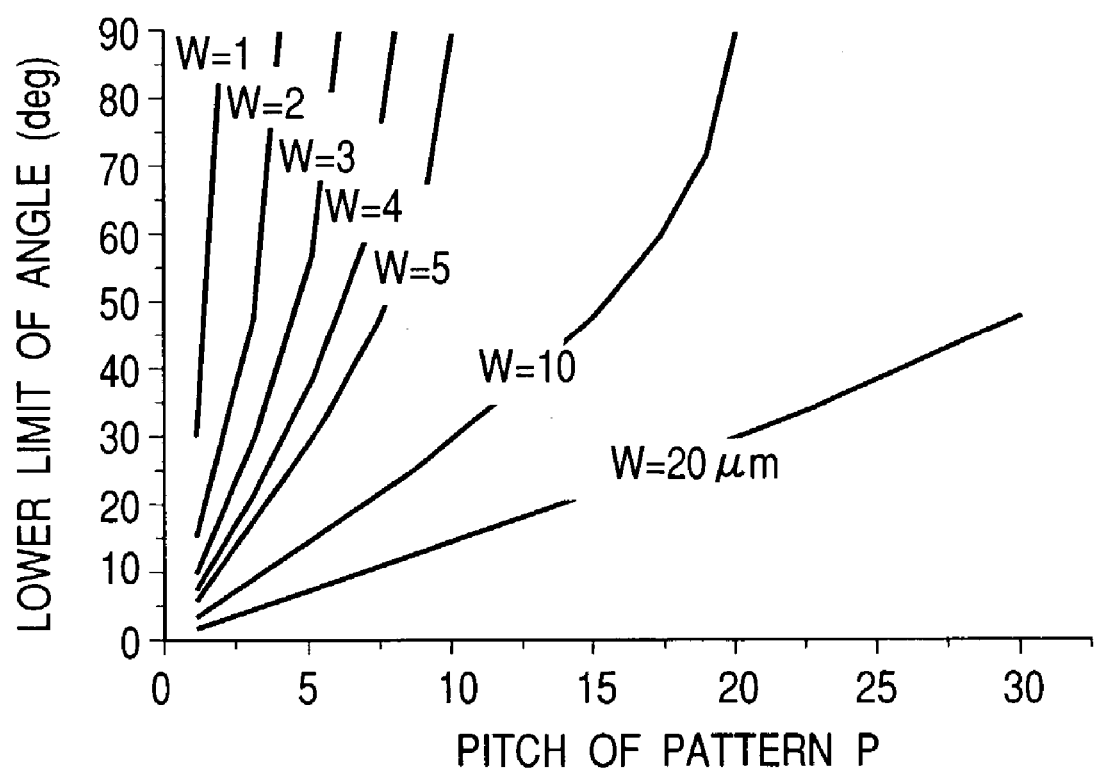
FIG. 16 is a graph showing the relation among the beam width of CW laser, the pitch of the stripy pattern of the phase-shifting mask, and the angle between the stripy pattern and the scanning direction.
Figure 17:
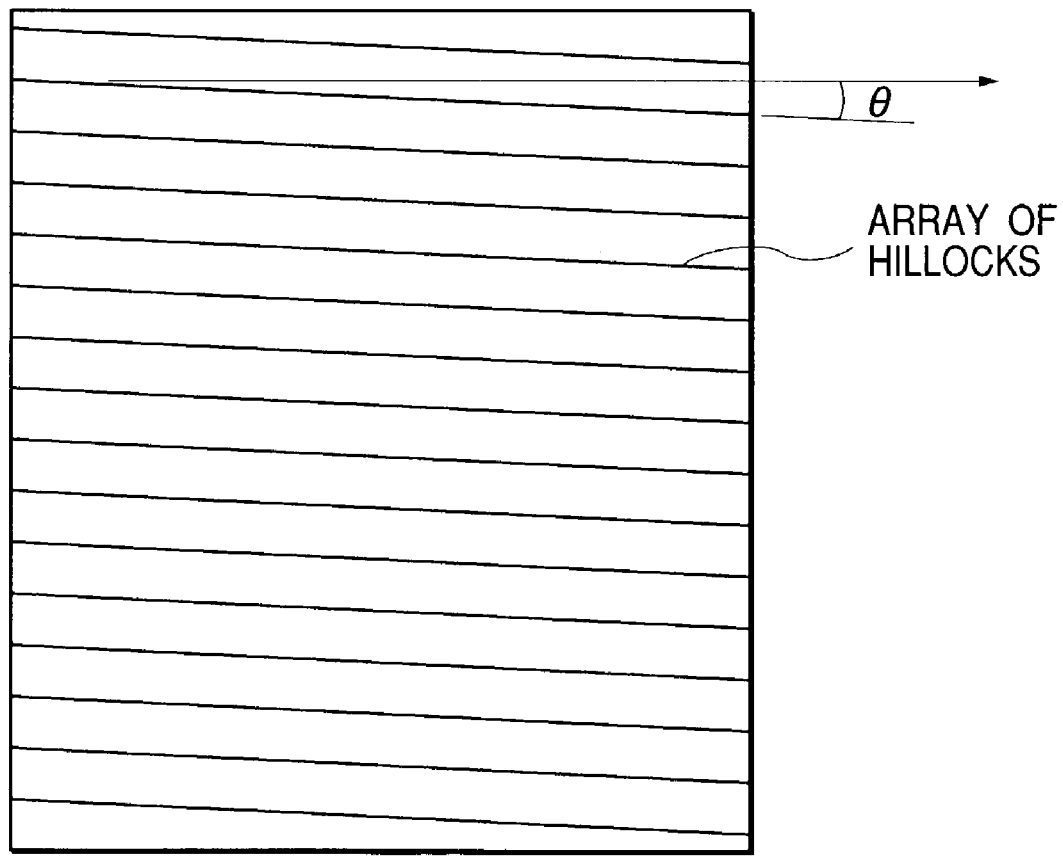
FIG. 17 is an array pattern of silicon hillocks resulting from pulse laser annealing by scanning with one-shot overlapping.
Figure 18:
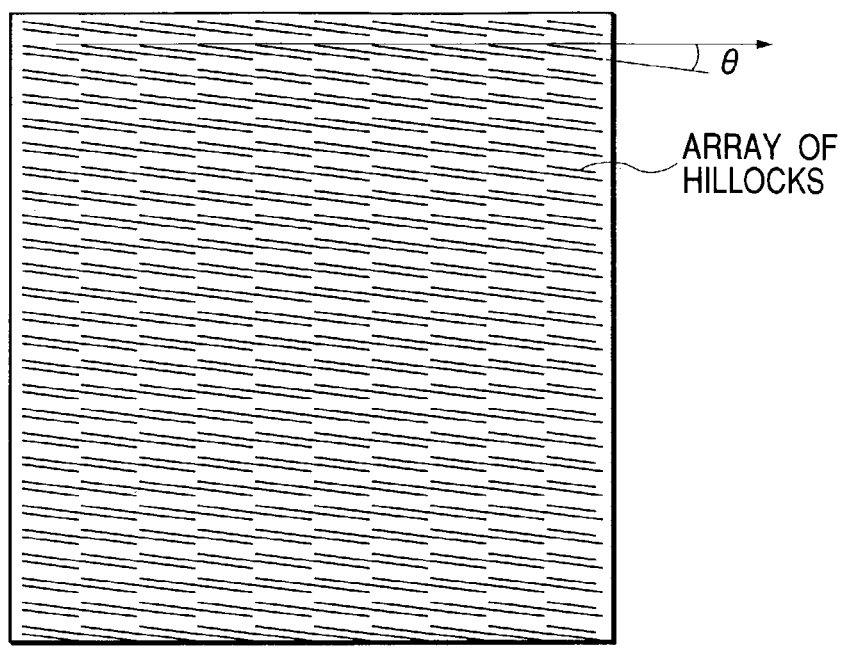
FIG. 18 is an array pattern of silicon hillocks resulting from pulse laser annealing by scanning with two-shot overlapping.
Figure 19:
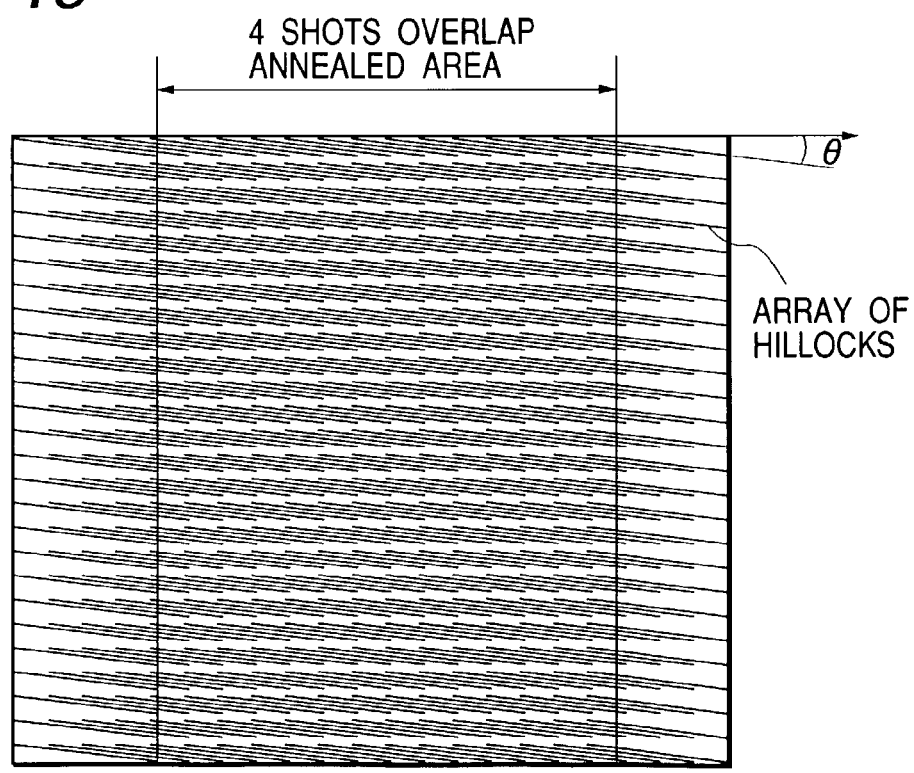
FIG. 19 is an array pattern of silicon hillocks resulting from pulse laser annealing by scanning with four-shot overlapping.

This example demonstrates annealing by scanning with CW laser through a phase-shifting mask having a periodic stripy pattern. The CW laser used in this example is YAG laser (10 W) having a wavelength of 532 nm as the second harmonics. Scanning is accomplished with a linear beam (500 μm in long axis and 10 μm in short axis) shaped by two cylindrical lenses of different type. The phase-shifting mask has a stripy pattern scribed at a pitch of 10 μm. The stripy pattern is inclined 35 degrees with respect to the scanning direction. This angle meets the requirements specified in FIG. 16. Scanning as mentioned above gives rise to a polycrystalline silicon film in which crystals grow in the lateral direction. The thus obtained polycrystalline silicon film is free from hillocks running parallel to the direction of stripes, unlike the one obtained by irradiation with pulsed laser beams.

As mentioned above, the present invention provides an improved process for laser annealing which makes it possible to produce a high-quality crystalline silicon thin film, which cannot be obtained by simply repeating laser irradiation, more efficiently than the conventional process.

What is claimed is:

1. A process for production of a polycrystalline semiconductor thin film which comprises having a means to shape laser light into a linear beam and a one-dimensionally periodic stripy pattern to spatially and periodically modulate the intensity of pulsed laser light in the direction of the long axis of the linear beam, wherein the pulsed laser light is solid-state laser light.

2. A process for production of a polycrystalline semiconductor thin film which comprises having a means to shape laser light into a linear beam and a one-dimensionally periodic stripy pattern to spatially and periodically modulate the intensity of pulsed laser light in the direction of the long axis of the linear beam, wherein a phase-shifting mask with a stripy pattern is used to modulate the intensity of the pulsed laser light, and the phase-shifting mask is formed with a raised and lowered stripy pattern formed on a surface of a quartz substrate.

3. A process for production of a polycrystalline semiconductor thin film as defined in claim 2, wherein laser irradiation is carried out while flowing a gas in the vicinity of the mask.

4. In a process of crystallization by irradiation of a semiconductor thin film formed on a substrate with pulsed laser light, a process for producing a polycrystalline semiconductor thin film which comprises having a means to scan the substrate, a means to shape laser light into a linear beam, a one-dimensionally periodic stripy pattern to spatially and periodically modulate the intensity of pulsed laser in the direction of the long axis of the linear beam, and repeating pulse irradiation by moving and scanning the substrate, with the angle between the direction of the stripe and the direction of scanning adjusted such that the amount of movement in the direction of scanning between shots is more than 20 μm and the amount of displacement of the distribution of the intensity of the irradiating light in the scanning direction and the vertical direction less than 1 μm.

5. A process for production of a polycrystalline semiconductor thin film as defined in claim 4, wherein the stripy pattern is a periodic phase-shifting pattern.

6. A process for production of a polycrystalline semiconductor thin film as defined in claim 4, wherein the stripy pattern is a periodic slit pattern.

7. A process for production of a polycrystalline semiconductor thin film as defined in claim 4, wherein laser irradiation is carried out while flowing a gas in the vicinity of the mask.

8. In a process of crystallization by irradiation of a semiconductor thin film formed on a substrate with pulsed laser light, a process for producing a polycrystalline semiconductor thin film which comprises having a means to shape laser light into a linear beam and a one-dimensionally periodic stripy pattern to spatially and periodically modulate the intensity of pulsed laser in the direction of the long axis of the linear beam, with the angle between the direction of the stripe and the direction of scanning is within the range from 0.1 to 2 degrees.

9. A process for production of a polycrystalline semiconductor thin film as defined in claim 8, wherein the one-dimensionally periodic stripy pattern is a periodic phase-shifting stripy pattern.

10. A process for production of a polycrystalline semiconductor thin film as defined in claim 8, wherein the one-dimensionally periodic stripy pattern is a periodic slit pattern.

11. A process for production of a polycrystalline semiconductor thin film as defined in claim 8, wherein laser irradiation is carried out while flowing a gas in the vicinity of the mask.

12. In a process of crystallization by irradiation of a semiconductor thin film formed on a substrate with pulsed laser light, a process for producing a polycrystalline semiconductor thin film which comprises having a means to shape laser light into a linear beam and a one-dimensionally periodic stripy pattern to spatially and periodically modulate the intensity of pulsed laser in the direction of the long axis of the linear beam, with the angle between the direction of the stripe and one side of the substrate being within the range from 0.1 to 2 degrees.

13. A process for production of a polycrystalline semiconductor thin film as defined in claim 12, wherein the one-dimensionally periodic stripy pattern is a periodic phase-shifting stripy pattern.

14. A process for production of a polycrystalline semiconductor thin film as defined in claim 12, wherein the one-dimensionally periodic stripy pattern is a periodic slit pattern.

15. A process for production of a polycrystalline semiconductor thin film as defined in claim 12, wherein laser irradiation is carried out while flowing a gas in the vicinity of the mask.

16. In a process of crystallization by irradiation of a semiconductor thin film formed on a substrate with pulsed laser light, a process for producing a polycrystalline semiconductor thin film which comprises having a means to shape laser light into a linear beam and a one-dimensionally periodic stripy pattern to spatially and periodically modulate the intensity of pulsed laser in the direction of the long axis of the linear beam, in which hillocks whose height is high locally compared with the surroundings are linearly arranged, the average distance of the arrays exists in a plural number, and the array is periodic, and there exist no amorphous regions between hillocks.

17. A process for production of a polycrystalline semiconductor thin film as defined in claim 16, wherein the one-dimensionally periodic stripy pattern is a periodic phase-shifting stripy pattern.

18. In a process of crystallization by irradiation of a semiconductor thin film formed on a substrate with pulsed laser light, a process for producing a polycrystalline semiconductor thin film which comprises having a means to shape laser light into a linear beam and a one-dimensionally periodic stripy pattern to spatially and periodically modulate the intensity of pulsed laser in the direction of the long axis of the linear beam, in which a plurality of pattern periods are the relation of multiple.

19. In a process of crystallization by irradiation of a semiconductor thin film formed on a substrate using CW laser light, a process for producing a semiconductor thin film which comprises having a means to shape the CW laser light into a linear beam and a means to modulate laser intensity periodically and spatially in the direction of the long axis of the linear beam, thereby forming a polycrystalline film composed of crystals grown in the in-plane direction over the entire region irradiated with the linear beam.

20. A process for production of a polycrystalline semiconductor thin film as defined in claim 19, wherein the means to modulate the laser intensity periodically and spatially in the direction of the long axis of the linear beam is a phase-shifting stripy pattern.

* * * * *